(12) United States Patent
Matsumoto

(10) Patent No.: US 7,659,966 B2
(45) Date of Patent: Feb. 9, 2010

(54) CONTAINER AND METHOD OF TRANSPORTING SUBSTRATE USING THE SAME

(75) Inventor: Ken Matsumoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 158 days.

(21) Appl. No.: 11/366,580

(22) Filed: Mar. 3, 2006

(65) Prior Publication Data

US 2007/0002516 A1  Jan. 4, 2007

(30) Foreign Application Priority Data

Jun. 30, 2005  (JP) .............................. 2005-193084

(51) Int. Cl.
*G03B 27/62* (2006.01)
(52) U.S. Cl. .............................. 355/75; 355/53; 355/72
(58) Field of Classification Search .................. 355/53, 355/72, 75; 206/710; 430/5
See application file for complete search history.

(56) References Cited

U.S. PATENT DOCUMENTS

| | | | | |
|---|---|---|---|---|
| 4,689,516 A | | 8/1987 | Yokoyama et al. | 310/317 |
| 4,775,877 A | * | 10/1988 | Kosugi et al. | 355/53 |
| 5,529,819 A | * | 6/1996 | Campi, Jr. | 428/14 |
| 6,216,873 B1 | * | 4/2001 | Fosnight et al. | 206/710 |
| 6,517,304 B1 | | 2/2003 | Matsumoto | 414/217 |
| 6,597,434 B2 | * | 7/2003 | Van Dijsseldonk | 355/75 |
| 6,778,258 B2 | * | 8/2004 | del Puerto et al. | 355/72 |
| 6,994,507 B2 | | 2/2006 | Matsumoto | 414/217 |
| 7,385,674 B2 | * | 6/2008 | Ishii | 355/53 |
| 2003/0035096 A1 | * | 2/2003 | Dao et al. | 355/75 |
| 2003/0164934 A1 | * | 9/2003 | Nishi et al. | 355/72 |

(Continued)

FOREIGN PATENT DOCUMENTS

JP  60-189950  9/1985

(Continued)

OTHER PUBLICATIONS

European Search Report dated Oct. 12, 2006, issued in corresponding European patent application No. EP 06 00 4224, forwarded in a Communication dated Oct. 23, 2006.

*Primary Examiner*—Edward J Glick
*Assistant Examiner*—Steven H Whitesell-Gordon
(74) *Attorney, Agent, or Firm*—Fitzpatrick, Cella, Harper & Scinto

(57) ABSTRACT

An exposure apparatus for performing exposure of a substrate to light via a reticle. The apparatus includes a first stage configured to hold a chuck. The chuck has a support base with an electrode, and forms a container, for one of the substrate and the reticle, together with a cover. The container electrostatically chucks the one on the support base by the electrode. A transporter transports the container in which the one is contained, and loads the chuck, which chucks the one, on the first stage without the cover. A second stage holds the other of the substrate and the reticle. The apparatus obtains a first positional shift amount between the chuck and the one chucked on the chuck before the transportation by the transporter, to measure a second positional shift amount between a reference mark on the chuck held by the first stage and a reference mark on the second stage, and corrects positions of the first and second stages based on the first and second positional shift amounts, to perform the exposure.

6 Claims, 16 Drawing Sheets

U.S. PATENT DOCUMENTS

| | | | |
|---|---|---|---|
| 2003/0218728 A1 | 11/2003 | del Puerto et al. | 355/51 |
| 2003/0224295 A1* | 12/2003 | Heerens et al. | 430/311 |
| 2005/0281639 A1 | 12/2005 | Matsumoto | 414/217 |
| 2006/0087639 A1 | 4/2006 | del Puerto et al. | 355/75 |
| 2007/0002516 A1 | 1/2007 | Matsumoto | 361/234 |

FOREIGN PATENT DOCUMENTS

| | | |
|---|---|---|
| JP | 62-288911 | 12/1987 |
| JP | 1-152727 | 6/1989 |
| JP | 7-27198 | 3/1995 |
| JP | 10-261700 | 9/1998 |
| JP | 2002-252162 | 9/2002 |
| WO | WO 2005047981 A2 * | 5/2005 |

* cited by examiner

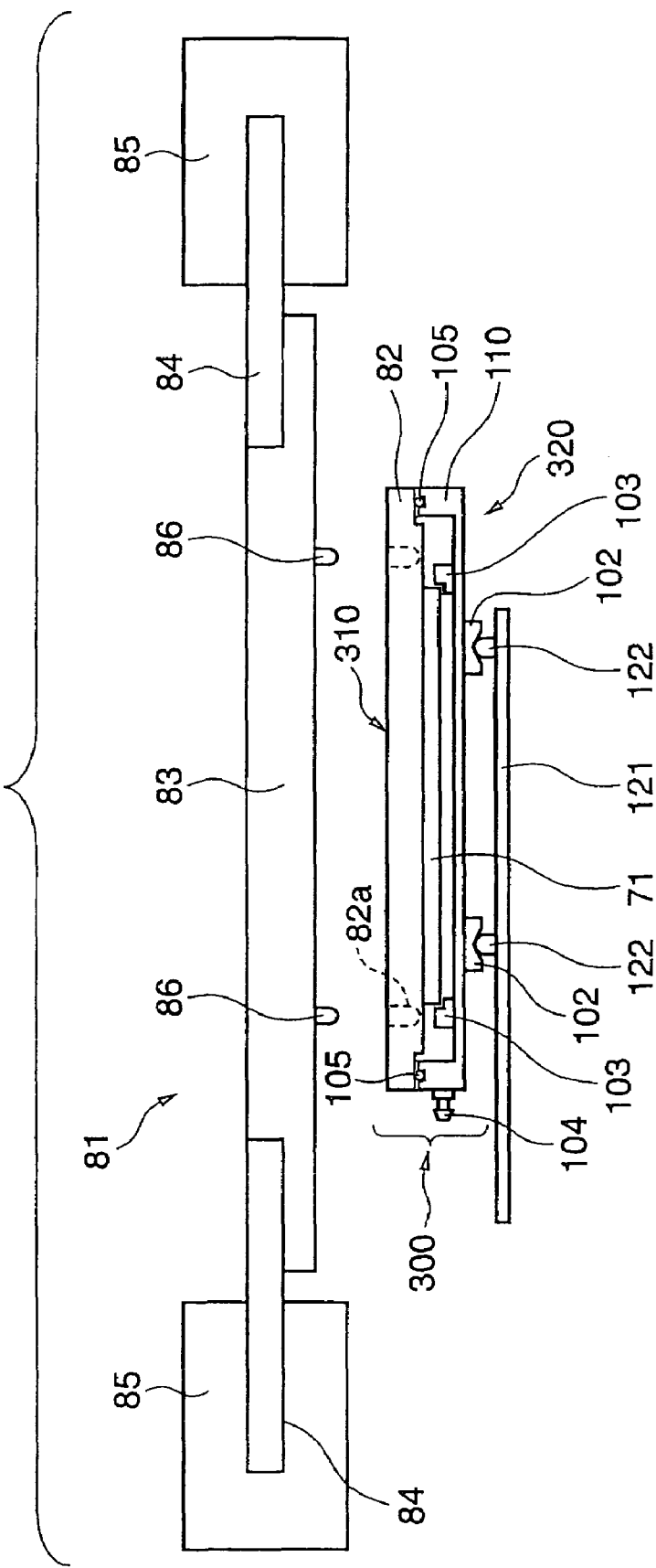

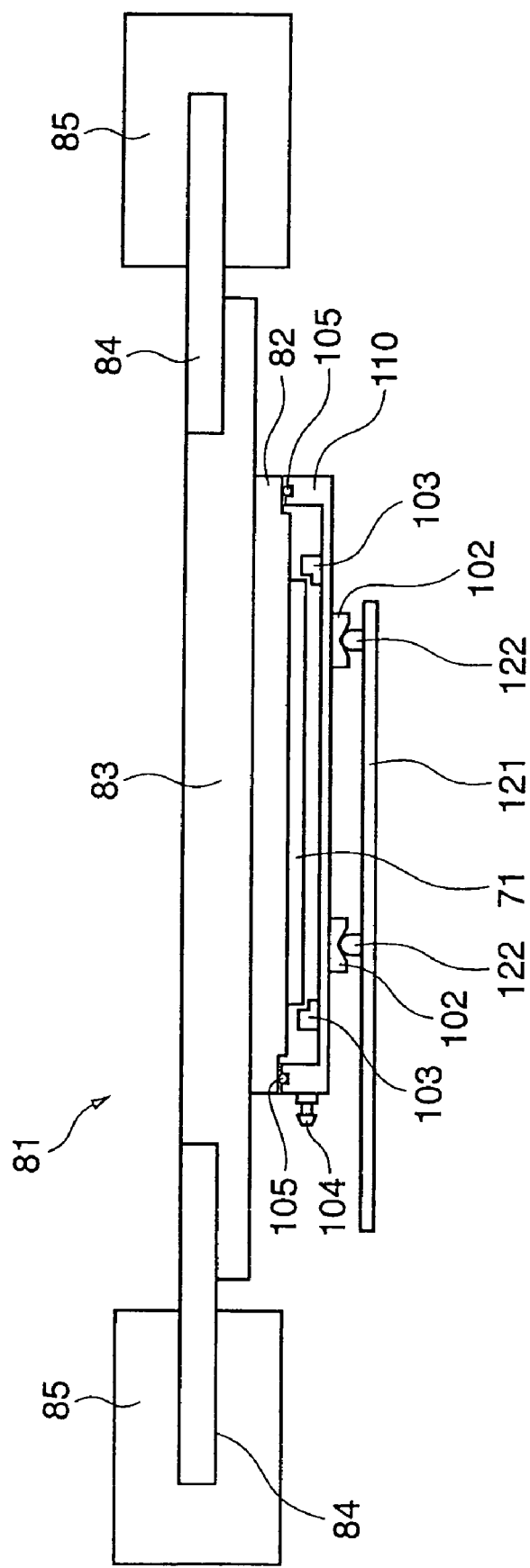

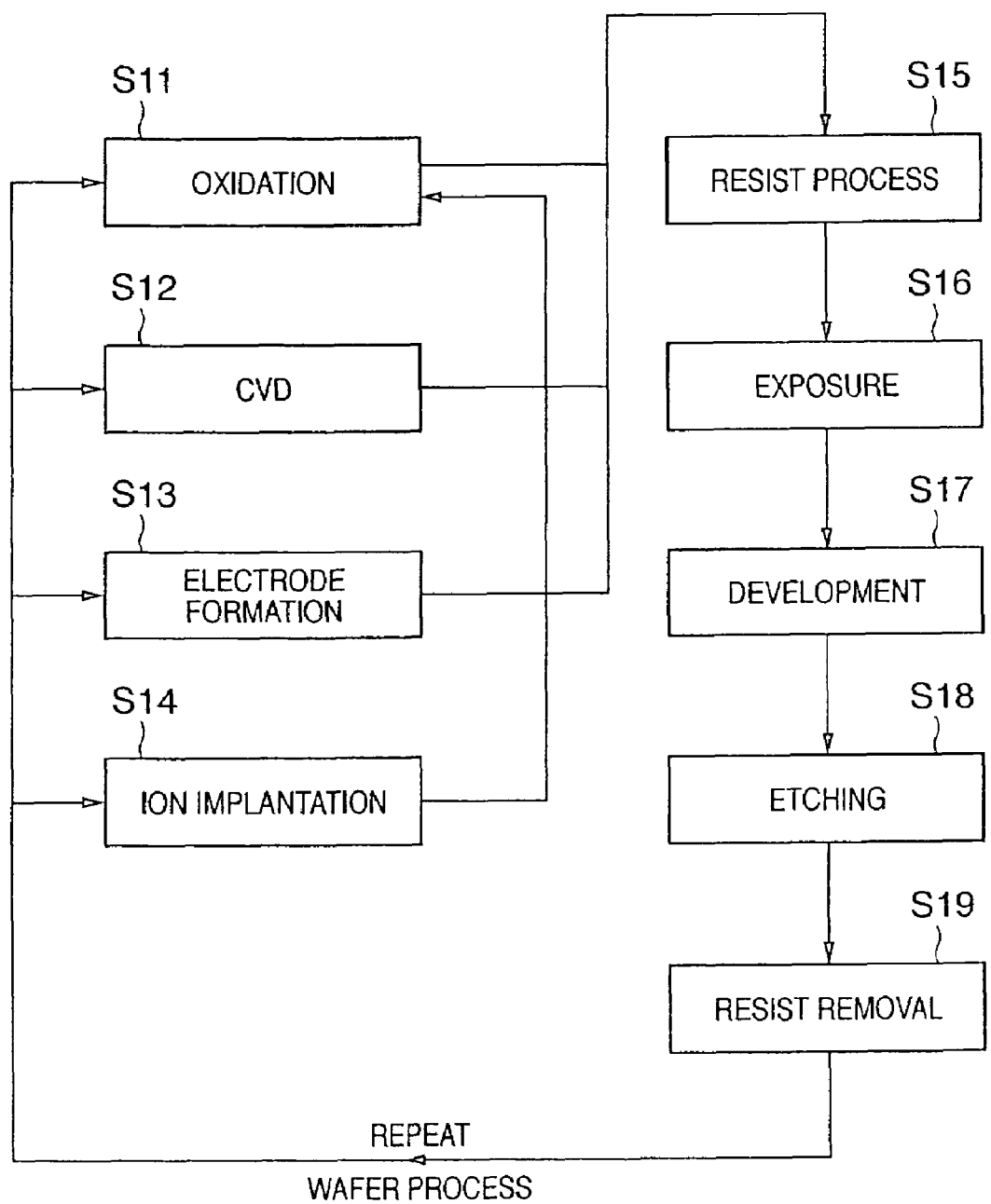

CONTAINER AND METHOD OF TRANSPORTING SUBSTRATE USING THE SAME

This application claims the benefit of Japanese Patent Application No. 2005-193084, filed on Jun. 30, 2005, which is hereby incorporated by reference herein in its entirety.

FIELD OF THE INVENTION

The present invention relates to a container for accommodating a substrate, such as a mask or a wafer, and a method of transporting the substrate using the same.

BACKGROUND OF THE INVENTION

In the exposure step of a semiconductor manufacturing process, a circuit pattern is formed on a reticle (photomask) is projected and exposed onto a wafer applied with a resist material to form a latent image pattern on the resist material. The latent image pattern is developed thereafter to form a resist pattern for etching, ion implantation, and the like.

If a particle, or the like, is present on the reticle, the particle, together with the pattern, is transferred onto the wafer to cause an error. In order to prevent this, a pattern protective member (including, e.g., a film-like synthetic resin member or a plate-like member made of silica glass, or the like), called a pellicle, is attached to the reticle.

The pellicle is arranged at a position offset from the pattern surface of the reticle by a predetermined distance and supported by a pellicle support frame. When the pellicle is used, a particle attaches to a pellicle surface offset from the pattern surface of the reticle by the predetermined distance. Hence, the particle does not directly form an image on the wafer surface during exposure, but appears as variations in illuminance of the illumination light to decrease errors caused by the particle.

FIG. 1 is a schematic view showing the structure of a pellicle. A pellicle 24 is adhered to the pattern surface side of a reticle 23 with an adhesive, or the like, through a reticle support frame 25. The pellicle 24 is formed of the reticle support frame 25 arranged to surround the circuit pattern on the reticle, and a pellicle film (or pellicle plate) 26 is adhered to one end face of the reticle support frame 25. The pellicle film 26 has high exposure light transmittance. If the space (to be referred to hereinafter as a pellicle space), surrounded by the pellicle 24 and reticle 23, is set in a completely sealed state, the pellicle film 26 may inflate or deflate due to the atmospheric pressure difference between the inside and outside of the pellicle space, which is inconvenient. To prevent this, vent holes 27 are formed in the reticle support frame 25 so a pressure difference does not occur between the inside and outside of the pellicle space. Also, dustproof filters (not shown) are provided to prevent an external particle from entering the pellicle space through the vent holes 27. In the manufacturing process of a semiconductor device, such as an LSI or VLSI, formed of very small patterns, a reduction projection exposure apparatus is used, which reduces and projects a circuit pattern formed on a reticle onto a wafer applied with a resist agent to form a latent image pattern on the resist agent. As the integration density of the semiconductor device increases, a further decrease in the feature size of the circuit pattern is required to lead a need for development of the resist process. Simultaneously, the exposure apparatus is required to have a thinner exposure beam width.

Methods of improving the resolution performance of the exposure apparatus include a method of further decreasing an exposure wavelength and a method of increasing the numerical aperture (NA) of a projection optical system. To decrease the exposure wavelength, a KrF excimer laser with an oscillation wavelength of 365-nm i-line to around 248 nm, and an ArF excimer laser with an oscillation wavelength around 193 nm, are used. Recently, exposure using a fluorine ($F_2$) excimer laser with an oscillation wavelength around 157 nm has also been developed.

When an ArF excimer laser with a wavelength around far ultraviolet rays, particularly, 193 nm, and a fluorine ($F_2$) excimer laser with an oscillation wavelength around 157 nm are to be used, a problem arises in that a plurality of oxygen ($O_2$) absorption bands are present around their wavelength bands. For this reason, the optical path of an exposure optical system in a projection exposure apparatus, which uses the ArF excimer laser with a wavelength around far ultraviolet rays, particularly, 193 nm, the fluorine ($F_2$) excimer laser with a wavelength around 157 nm, or the like, as a light source, is purged with an inert gas, such as nitrogen. This suppresses the oxygen concentration in the optical path to a low level, on the several ppm order or less. Similarly, moisture ($H_2O$) must also be suppressed to a low level, on the several ppm order or less.

In order to ensure the transmittance and stability of the fluorine ($F_2$) excimer laser beam in this manner, a reticle stage including a projection lens end face and length measurement interference optical system, and an entire wafer stage, must be arranged in a hermetic chamber, and the interior of the hermetic chamber must be entirely purged with a high-purity inert gas. Also, in order to load and unload a wafer or reticle in and from the hermetic chamber with the inert gas concentration in the hermetic chamber being kept at a constant level, a load-lock chamber is arranged adjacent to the hermetic chamber. Regarding the pellicle space, the illuminance there may be undesirably similarly decreased by light absorption. To prevent this, when unloading a reticle, the pellicle space in the load-lock chamber, or the like, must be purged with an inert gas.

FIG. 2 is a schematic view showing an example of a semiconductor exposure apparatus, which uses a fluorine ($F_2$) excimer laser as a light source and has a load-lock mechanism.

Referring to FIG. 2, a reticle on which a pattern is drawn is loaded on a reticle stage 1. The pattern on the reticle is transferred onto a wafer in an exposure unit 2. The exposure unit 2 includes a projection optical system, which projects the reticle pattern onto the wafer, an illumination optical system, which illuminates the reticle, and the like. Illumination light from a fluorine ($F_2$) excimer laser light source (not shown) is guided to the exposure unit 2 through a guide optical system.

The reticle stage 1 is covered with a housing 8 and purged with an inert gas. The entire exposure apparatus is covered with an environment chamber 3. Air controlled to a predetermined temperature circulates in the environment chamber 3 to keep the internal temperature of the environment chamber 3 constant. Clean air, which is temperature-controlled by an air-conditioner 4, is supplied to the environment chamber 3. The air-conditioner 4 also has a function of adjusting a predetermined portion, such as an optical system, to an inert gas atmosphere.

The housing 8, which covers the reticle stage 1, is connected to a reticle load-lock 13, which is used when loading and unloading the reticle in and from the housing 8. A reticle hand 15 loads and unloads the reticle and transports the reticle in the housing 8. A reticle storage 18, which stores a plurality of reticles, is arranged in the housing 8. A particle inspection unit 19, which measures and counts the size and number of particles, such as dust attaching to the reticle surface or pellicle surface, is arranged in the housing 8.

An SMIF (Standard Mechanical InterFace) pod 14, which stores the reticle, and a reticle relay hand 16, which transports the reticle between the SMIF pod 14 and the load-lock 13, are arranged in the environment chamber 3. After the reticle is loaded in the load-lock 13, the interior of the load-lock 13 is purged with the inert gas to set it to an inert gas atmosphere identical to that in the housing 8. Then, the reticle hand 15 transports the reticle to the reticle stage 1, the reticle stage 18, or particle inspection unit 19.

An exposure apparatus, which uses an extreme ultraviolet light (EUV light), with a wavelength around 10 nm to 15 nm in the soft X-ray range or an electron beam (EB) is also under development as a next-generation light source. When the wavelength of exposure light decreases to the level of the EUV light or an electron beam, air under the atmospheric pressure no longer transmits the light. Hence, the optical path of the exposure light must be set to a high-vacuum environment of about $10^{-4}$ Pa to $10^{-5}$ PA or more. For this purpose, the reticle stage, including the projection lens end face and length measurement interference optical system, and the entire wafer stage must be arranged in a vacuum chamber, which is more hermetic than the $F_2$ exposure apparatus. A load-lock chamber must be arranged at a wafer or reticle unloading/loading port. A wafer or reticle must be unloaded or loaded while keeping the vacuum degree in the vacuum chamber.

In EUV exposure, a material that transmits EUV light highly efficiently is not available. Hence, a reflection type mask having a pattern surface formed of a multilayered film is used, as disclosed in Japanese Patent Publication No. 7-27198. FIG. 4 is a schematic view of a reflection type mask used for EUV exposure. A reflection type mask 71 is made of a material having a coefficient of linear thermal expansion of 30 ppb/C.° or less. As the material of the reflection type mask 71, titanium-doped silica glass, a two-phase glass ceramic material, or the like, can be used. A multilayered film 72 is composed of a reflection layer having a multilayered film structure, such as Mo—Si, and an absorber, which absorbs soft X-rays, and forms an exposure pattern. A conductive film 73 is used to fix the reflection type mask 71 to an electrostatic chuck.

FIG. 3 is a view showing an arrangement of a mask stage in a semiconductor exposure apparatus, which uses EUV light as a light source. An EUV exposure stage is arranged above a reduction projection optical system in the exposure apparatus. A mask is held with its upper surface checked, so that a substrate is photosensitized by reflection light. Referring to FIG. 3, a reflection type mask stage 81 has an electrostatic mask 82, which holds the mask 71 by chucking with an electrostatic force during exposure. In a high vacuum atmosphere of about $10^{-4}$ Pa to $10^{-5}$ Pa, serving as an EUV exposure atmosphere, the mask cannot be held by conventional vacuum chucking, and a reticle is held by an electrostatic chuck using the Coulomb force or Johnson-Rahbeck force (to be referred to as the electrostatic force hereinafter), which is generally employed in a vacuum apparatus. In this case, in order to increase the force to hold the reticle, the conductive film 73 may be formed on the chuck holding surface on the mask 71, as disclosed in Japanese Patent Laid-Open No. 1-152727. Referring to FIG. 3, reference numeral 83 denotes a top plate; reference numeral 84, a linear motor movable element; and reference numeral 85, linear motor stators, respectively.

As described, when the wavelength of exposure light decreases to fall within the EUV range, no material can transmit the light efficiently, and no matter what existing material may be used, EUV light is absorbed undesirably. Accordingly, the conventional method of dust-proofing a reticle by a pellicle cannot be employed. In view of this, a removable pellicle is proposed, which is mounted on a reticle when transporting the reticle and removed from the reticle immediately before exposure.

If a removable pellicle is realized using a conventional pellicle, when a load-lock chamber is to be evacuated from the atmospheric pressure to a vacuum state (or vice versa), in order to move the reticle from the atmosphere into a vacuum, the pellicle may be broken by the pressure difference between the inside and outside of the pellicle. Hence, the pellicle must have a strength that can withstand such a pressure difference, or a new dustproof method must be proposed.

In order to prevent particles from entering the pellicle space, the pellicle must be fixed to the reticle such that the hermeticity of the pellicle space can be maintained, and must be detachably held so that it can be removed from the reticle easily for exposure. Japanese Patent Laid-Open No. 2002-252162 discloses holding the hermeticity using an O-ring. As the O-ring has adhesion, when it is brought into contact with the reticle, it adheres to the reticle. In this state, when the O-ring is separated from the reticle, dust is produced. The produced dust can attach to the pattern surface of the reticle with the electrostatic force. If the produced dust drops inside the removable pellicle, when the pellicle space is to be vacuum-evacuated or broken in the load-lock chamber, the produced dust may float in the pellicle space to undesirably attach to the pattern surface.

Management of only the particles on the pattern surface is not sufficient. When the reticle is fixed to the chuck on the exposure stage, if a particle is sandwiched between the chuck and reticle, it deforms the reticle to distort the pattern surface irregularly, leading to a decrease in exposure performance. It is said that in EUV exposure, with a degradation in accuracy (flatness) of the pattern surface of only about fifty nanometers, the exposure accuracy cannot be satisfied. Accordingly, the particle management on the nanometer order is necessary. In order to solve these problems, a method of decreasing the contact area of the chuck and reticle by using a pin chuck is available. With this method, although the probability of particle sandwiching can be decreased, it cannot be nullified.

SUMMARY OF THE INVENTION

The present invention has been made based on the recognition of the above problems, and has as its object to provide an exposure apparatus advantageous in using a container that protects one of a reticle and a substrate from a particle, which is formed by a chuck for the one, and which is transported to a stage for holding the chuck.

According to a first aspect of the present invention, there is provided a container, for accommodating a substrate, comprising a chuck which chucks and holds the substrate, and a cover which forms a storage space together with the chuck, wherein the substrate is held in the storage space with the cover being mounted on the chuck.

According to a preferred embodiment of the present invention, preferably, the container further comprises a port to perform any one of controlling a pressure in the storage space and filling the storage space with an inert gas.

According to another preferred embodiment of the present invention, preferably, the chuck has an electrode to electrostatically chuck the substrate and is configured as an electrostatic chuck.

According to still another preferred embodiment of the present invention, preferably, the container further comprises a battery to supply power to the electrode.

According to still another preferred embodiment of the present invention, preferably, the container further comprises a power supply control circuit, which selectively supplies power provided from any one of the battery and an external device to the electrode.

According to still another preferred embodiment of the present invention, preferably, the container further comprises a drop preventive member which prevents the substrate from dropping when the electrode stops electrostatic chucking.

According to still another preferred embodiment of the present invention, preferably, the cover is provided with a kinematic coupling mechanism.

According to still another preferred embodiment of the present invention, preferably, the chuck has an aligning portion to be aligned on a stage.

According to still another preferred embodiment of the present invention, preferably, the container further comprises a seal member which seals the chuck and the cover.

According to still another preferred embodiment of the present invention, preferably, the cover has a dustproof wall inside a region where the seal member is arranged.

According to still another preferred embodiment of the present invention, preferably, an adhesive material is arranged on an inner surface of the cover.

According to still another preferred embodiment of the present invention, preferably, the cover is configured to be capable of destaticizing the mask storage space by an ionizer.

According to still another preferred embodiment of the present invention, preferably, the cover includes a portion that transmits destaticizing light so that the storage space can be destaticized by an irradiation ionizer.

According to the second aspect of the present invention, there is provided a substrate transporting method of transporting a substrate, comprising steps of transporting, to a stage, a container comprising a chuck, which chucks and holds the substrate, and a cover, which forms a storage space together with the chuck, with the substrate being held in the storage space of the container by the chuck, fixing the chuck to the stage, and separating the cover from the chuck of the container.

According to still another preferred embodiment of the present invention, preferably, the cover is fixed to the chuck by setting the storage space to a pressure-reduced state.

According to still another preferred embodiment of the present invention, preferably, the chuck is configured as an electrostatic chuck.

According to still another preferred embodiment of the present invention, preferably, the method further comprises a step of inspecting a particle on a contact surface between the substrate and the chuck before the substrate is held by the chuck.

According to still another preferred embodiment of the present invention, preferably, the method further comprises a step of inspecting any one of a flatness of the substrate and a distortion of a pattern drawn on a mask while the substrate is held by the chuck.

According to still another preferred embodiment of the present invention, preferably, the method further comprises a step of destaticizing the storage space.

According to still another preferred embodiment of the present invention, preferably, the method further comprises, before a step of fixing the chuck to the stage, a step of performing position adjustment so that positions relative to each other of a reference portion formed on the chuck and a reference portion formed on the substrate fall within a predetermined range.

According to the present invention, a substrate, such as a mask or a wafer, can be transported while protecting it from a particle, and use of the substrate after the transportation can be facilitated.

More specifically, according to the present invention, a substrate is held by the chuck and transported into a storage space formed of, e.g., the chuck and a cover, so that the substrate can be protected from a particle during the transportation. After the transportation, the cover is separated from the chuck, so that the substrate held by the chuck can be used immediately.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11A is a view showing a mask use procedure (feed procedure);

FIG. 11B is a view showing a mask use procedure (feed procedure);

FIG. 14 is a flowchart showing the flow of a wafer process in detail.

DETAILED DESCRIPTION OF THE PREFERRED EMBODIMENTS

The preferred embodiments of the present invention will be described with reference to the accompanying drawings.

First Embodiment

Figure 1:
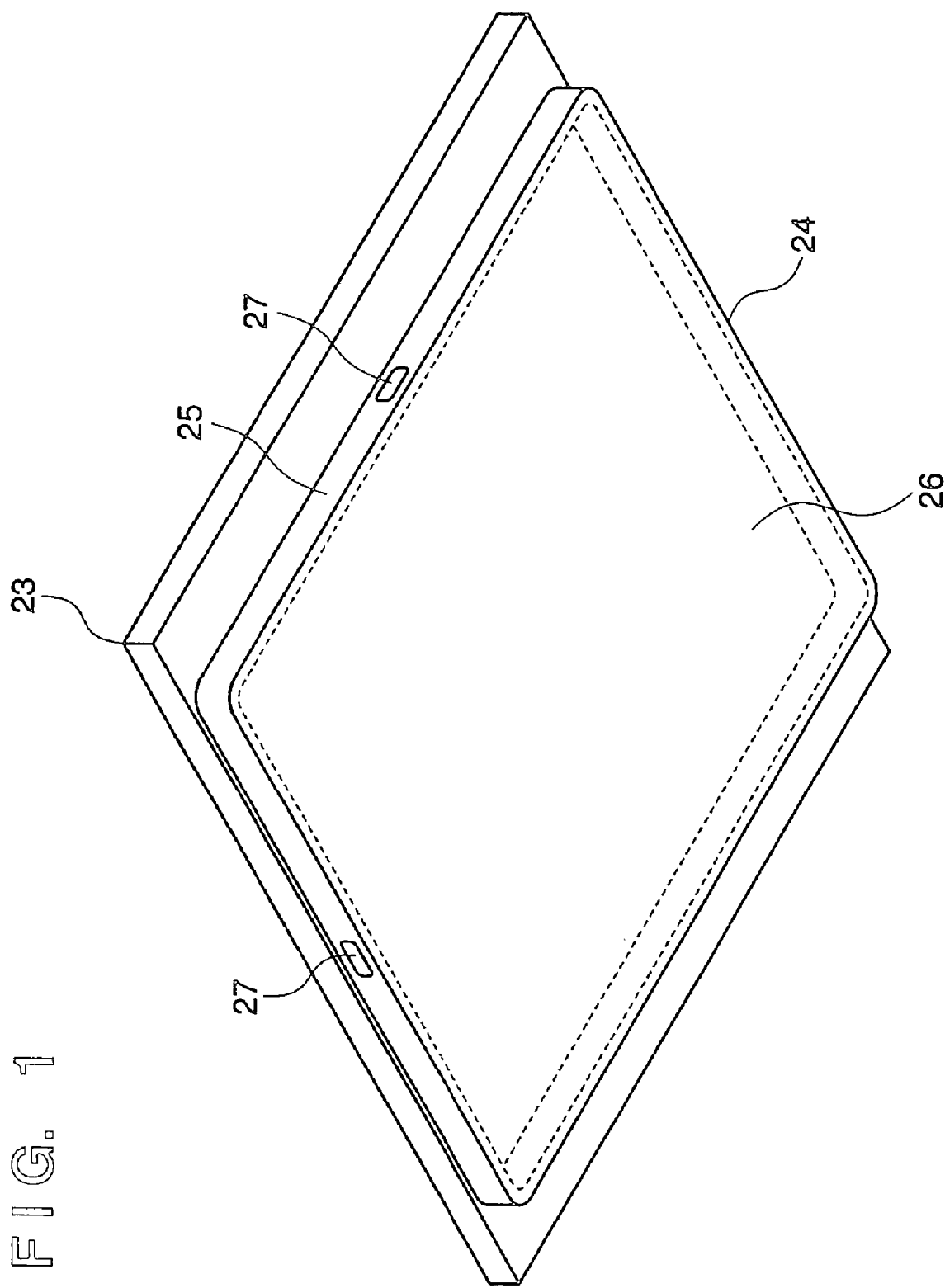
FIG. 1 is a schematic view showing the structure of a pellicle.
Figure 2:
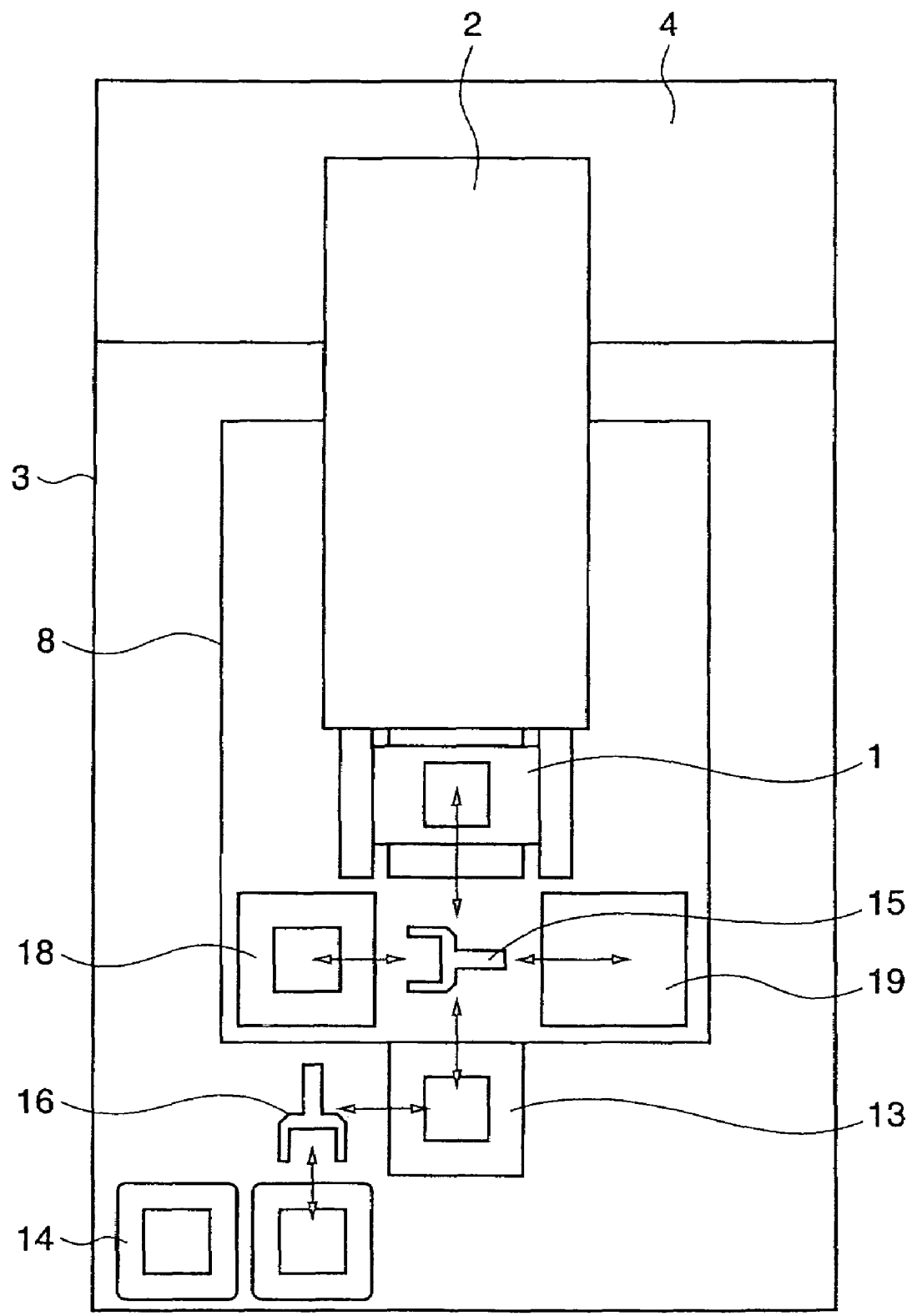
FIG. 2 is a schematic view showing an example of a semiconductor exposure apparatus, which uses an $F_2$ excimer laser as a light source and has a load-lock mechanism.
Figure 3:
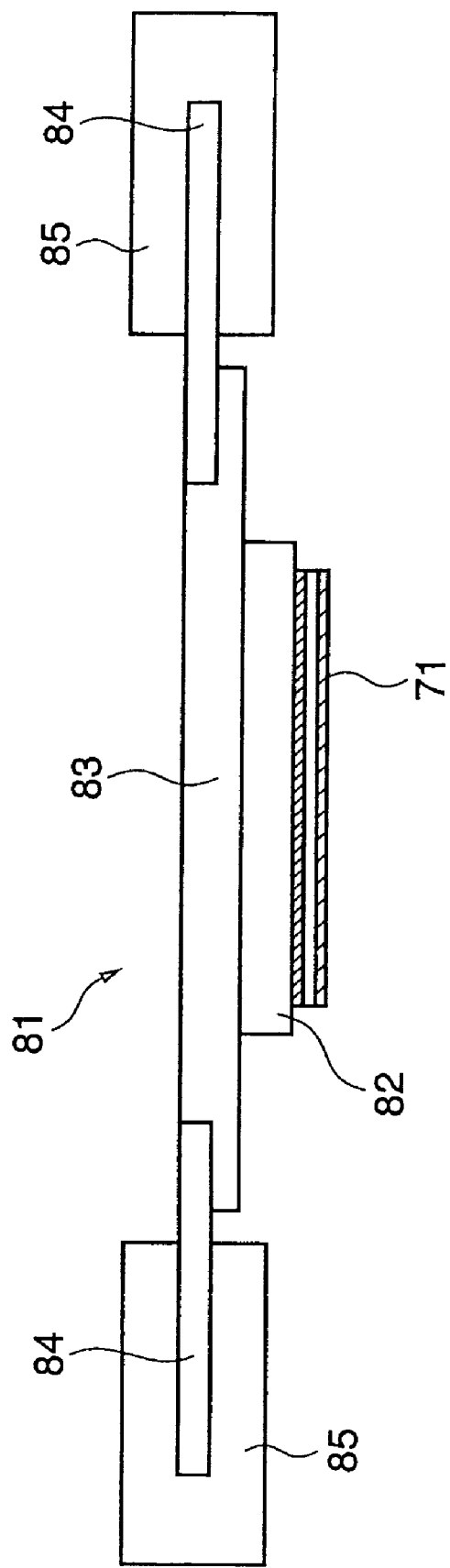
FIG. 3 is a view showing an arrangement of a mask stage in a semiconductor exposure apparatus, which uses EUV light as a light source.
Figure 4:
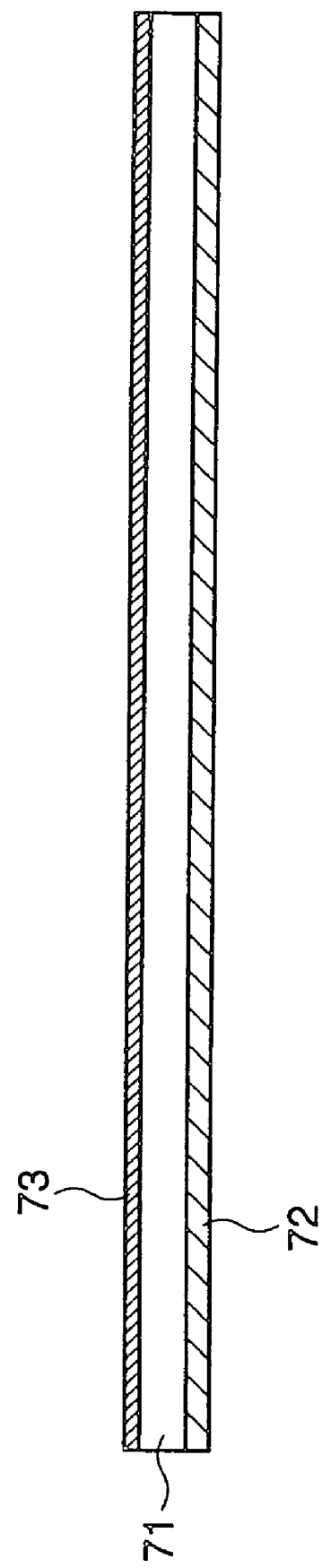
FIG. 4 is a schematic view of a reflection type mask used in EUV exposure.
Figure 5:
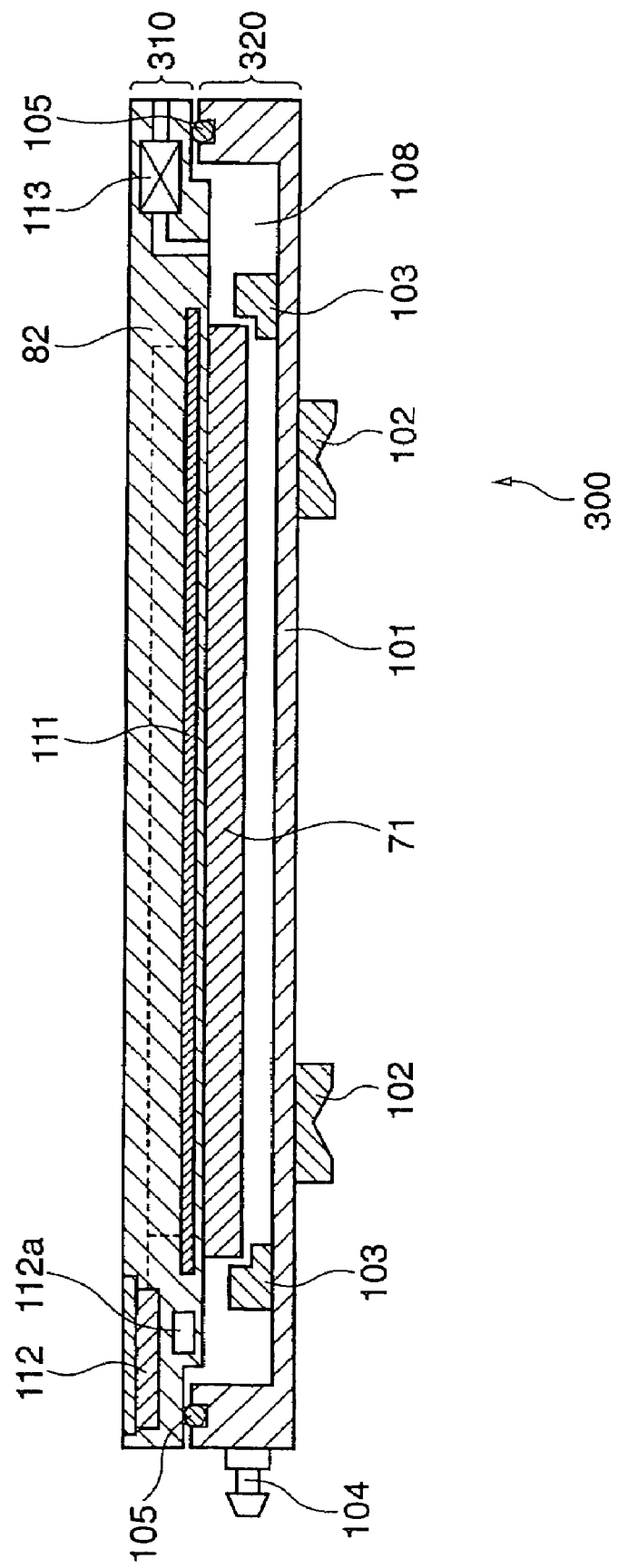
FIG. 5 is a sectional view showing the schematic structure of a mask container according to the first embodiment of the present invention.
Figure 9:
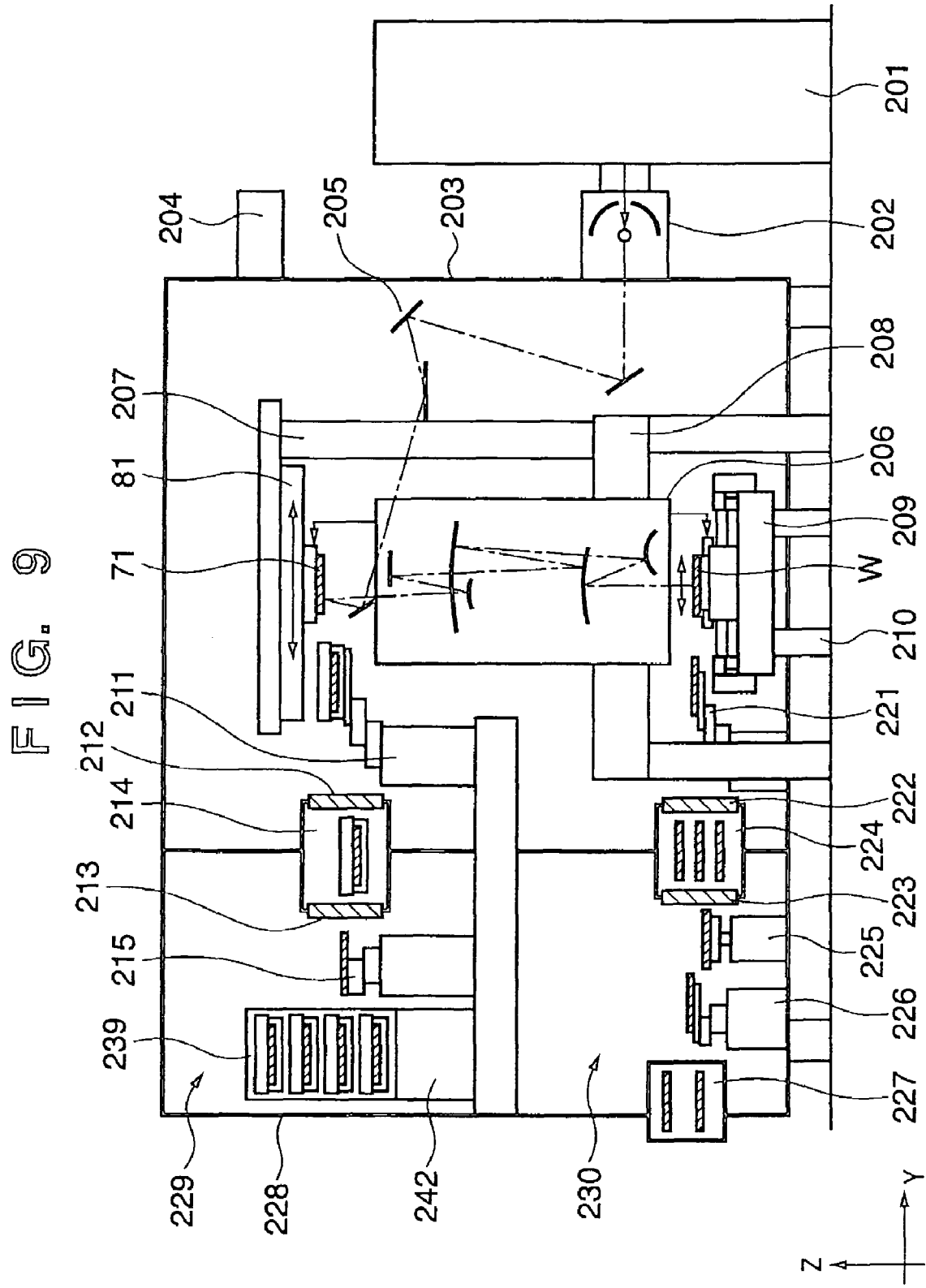
FIG. 9 is a side view showing the entire structure of an EUV exposure apparatus which suitably uses the mask container shown in FIG. 5.
Figure 10:
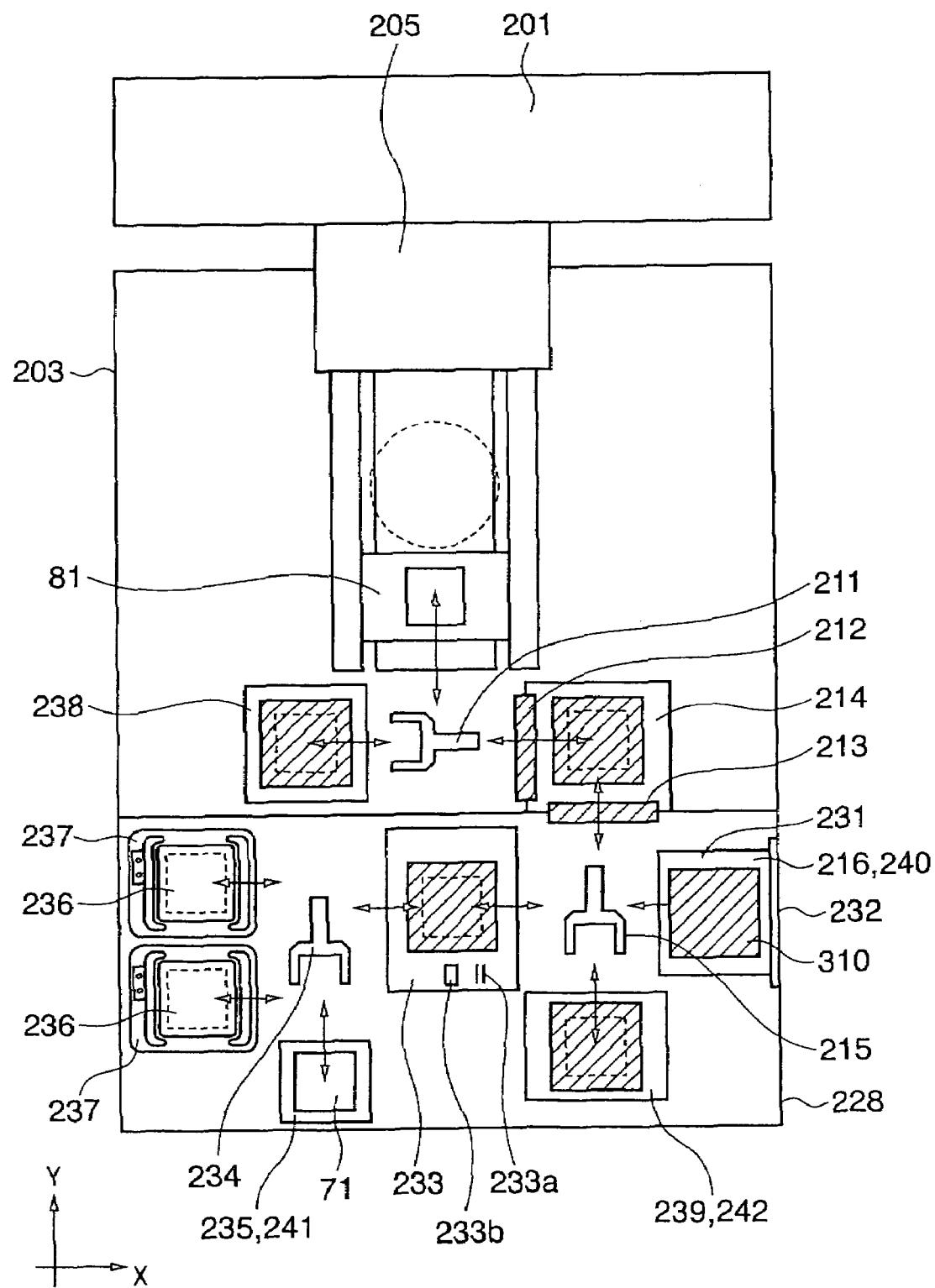
FIG. 10 is a plan view showing the entire structure of the EUV exposure apparatus which suitably uses the mask container shown in FIG. 5.

FIG. 5 is a sectional view showing the schematic structure of a mask container according to the first embodiment of the present invention. FIGS. 9 and 10 are side and plan views, respectively, showing the entire structure of an EUV exposure apparatus, which suitably uses the mask container shown in FIG. 5.

First, the EUV exposure apparatus will be briefly described with reference to FIGS. 9 and 10. A laser device 201, serving as a light source, has a light-emitting portion 202. As the laser device, one which excites a gas, such as Xe (xenon) or Sn (tin) to a plasma state to generate light in an EUV wavelength range, is proposed. EUV light generated by the light-emitting portion 202 is guided into the exposure apparatus through an exposure light guide portion 205. The main body portion of the exposure apparatus is housed in the vacuum chamber 203. The interior of the vacuum chamber 203 is vacuum-evacuated by a vacuum pump 204 to maintain a high vacuum state.

The exposure apparatus incorporates a mask stage 81, reduction projection optical system 206, wafer stage 209, and the like. A reflection type mask 71 formed with an exposure pattern is loaded on the movable portion (top plate) of the mask stage 81. The reduction projection optical system 206 reduces and projects light, reflected by the mask 71 and includes the exposure pattern, onto a wafer W on the wafer stage 209. The reduction projection optical system 206 sequentially reflects the light, provided by the mask 71 and includes the exposure pattern, by a plurality of mirrors, to reduce and to project it onto the wafer W with a specified reduction magnification. For example, the wafer stage 209 can align the wafer W in six axes (X-axis, Y-axis, Z-axis, tilt about the X-axis, tilt about the Y-axis, and θ rotation about the Z-axis).

The reduction projection mirror optical system 206 is supported on the floor by a projection system support 208. The mask stage 81 is supported on the floor by a mask stage support 207. The wafer stage 209 is supported on the floor by a wafer stage support 210.

The reticle stage support 207, projection system support 208, and wafer stage support 210 respectively support the reticle stage 81, reduction projection mirror optical system 206, and wafer stage 209, independently of each other. The positions of the reticle stage 81 and reduction projection mirror optical system 206 relative to each other and those of the reduction projection mirror optical system 206 and wafer stage 209 relative to each other are maintained at target relative positions while they are measured by measurement units (not shown).

The reticle stage support 207, projection system support 208, and wafer stage support 210 are provided with dampers (not shown), which insulate vibration from the floor where the exposure apparatus is installed.

A mask transport device 229 and wafer transport device 230 are arranged in a transport system chamber 228, which is adjacent to the vacuum chamber 203. The interior of the transport system chamber 228 is set at a pressure slightly higher than that of the atmosphere inside the transport system chamber, typically, higher than that in the clean room atmosphere, so as to prevent a particle from flowing into the transport system chamber 228.

A transport robot 211 arranged in the vacuum chamber 203 supplies the mask 71 to the reticle stage 81 and recovers it from the reticle stage 81.

The space in the transport system chamber 228 is connected to that in the vacuum chamber 203 through a load-lock chamber 214. The load-lock chamber 214 is connected to the vacuum chamber 203 through a gate valve 212 and to the transport system chamber 228 through a gate valve 213. The mask is transported between the transport system chamber 228 and vacuum chamber 203 by opening and closing the gate valves 212 and 213.

A container stocker 239, which stores a mask container 300 exemplified in FIG. 5, and a chuck particle inspection unit 242, which inspects whether or not a particle attaches to a chuck 310 that forms part of the mask container 300, are also arranged in the transport system chamber 228.

The space in the transport system chamber 228 is also connected to that in the vacuum chamber 203 through a load-lock chamber 224. The load-lock chamber 224 is connected to the vacuum chamber 203 through a gate valve 222 and to the transport system chamber 228 through a gate valve 223. The wafer is transported between the transport system chamber 228 and vacuum chamber 203 by opening and closing the gate valves 222 and 223.

A prealignment portion 225 and wafer transport robot 226 are also arranged in the transport system chamber 228. The prealignment portion 225 measures the outer shape of the wafer W, aligns the wafer W in a θ rotational direction with reference to an orientation flat or notch, and aligns the wafer W in X and Y directions with reference to the wafer center or a predetermined portion of the outer shape of the wafer. The wafer transport robot 226 supplies a wafer, applied with a resist (photosensitive agent) by a coater developer, from an in-line 227 to the prealignment portion 225, and discharges an exposed wafer to the in-line 227. The in-line 227 is a transfer station where the wafer is exchanged between the exposure apparatus and the coater developer (not shown), which applies the resist (photosensitive agent) to an unexposed wafer and develops an exposed wafer.

The transport chamber 228 is provided with an unloading/loading portion 231. When an exchange door 232 is opened, a cover 320 and the chuck 310, which form the container 300, can be unloaded and loaded between the transport system chamber 228 and the outside. When unloading and loading are not to be performed, the exchange door is closed.

In the transport system chamber 228, a chuck stocker 216, which can store a plurality of chucks 310 and a cover stocker 240, which can store a plurality of covers 320, are arranged above the unloading/loading portion 231.

When the chuck 310 and cover 320 are to be loaded from the outside of the apparatus to the unloading/loading portion 231 and unloaded from the unloading/loading portion 231 to the outside of the apparatus, the chuck 310 and cover 320 are preferably each transported alone, or transported after they are combined to form a container 300 and stored in a dust-proof case, or the like.

A mask preparation station 233 is arranged in the transport system chamber 228. At the mask preparation station 233, the mask 71 is fixed to the chuck 310. After it is confirmed by the inspection of the mask pattern surface that no particle is sandwiched between the chuck 310 and mask 71 (if a particle is sandwiched, after it is washed off, as will be described later), the cover 320 is attached to the chuck 310.

The mask preparation station 233 preferably has a vacuum evacuation line 233a to set a mask storage space (pressure-reduced state), in advance, so as to shorten the time required to send the mask 71 to the vacuum chamber 203 or mask stage 81. The mask preparation station 233 also preferably has an irradiation ionizer 233b, such as an ultraviolet irradiation ionizer, which uses EUV light, or the like, or a soft X-ray ionizer, which uses soft X-rays, so as to prevent the mask 71 from being electrically charged by fluid friction during vacuum evacuation. The mask container 300, which has chucked a mask prepared at the mask preparation station 233, is transported to a container stocker 239 arranged in the transport system chamber 228 or a container stocker 238 arranged in the vacuum chamber 203 through the load-lock chamber 214, or sent to the reticle stage 81 directly. The chuck inspection unit 242 can be arranged, e.g., under the container stocker 239.

The mask 71 is loaded into the transport system chamber 228 by an SMIF pod (carrier) 236 from a mask stocker arranged outside the exposure apparatus or another apparatus. As the SMIF pod, for example, a single pod, which can store one mask and a multipod, which can store a plurality of masks, are available.

An SMIF indexer 237 is arranged in the transport system chamber 228. The SMIF indexer 237 has a pod opening/closing mechanism and an elevating mechanism to guide the mask from the SMIF pod 236 set in a load port above the SMIF indexer 237 into the transport system chamber 228.

A mask stocker 235 is also arranged in the transport system chamber 228. The mask stocker 235 can store a plurality of masks, which are loaded into the transport system chamber 228 by the SMIF pod 236 and SMIF indexer 237. An inspection unit, which inspects the presence/absence of a particle attaching to the mask, can be arranged above or under the mask stocker 235.

The mask container according to the first embodiment of the present invention will be described with reference to FIG. 5. The mask container 300 is a container, which accommodates a reflection mask 71, and is formed of a chuck 310 and cover 320. The reflection mask 71 has an exposure pattern formed by, e.g., an Mo—Si multilayered film.

The chuck 310 is configured as an electrostatic chuck. The chuck 310 has a support base 82 with a support surface which supports the mask 71 and an electrode 11 arranged in the support base 82. The reflection mask 71 is held as the electrode 111 is chucked by the support surface of the support base 82 with the electrostatic force generated by the electrode 111. The chuck 310 has a battery 112 and power supply control circuit 112a. When power is not externally supplied to the chuck 310 (for example, during transportation), power to hold the reflection mask 71 by electrostatic chucking is supplied from the battery 112 to the electrode 111 through the power supply control circuit 112a. When power is supplied to the chuck 310 from an external device (for example, a state wherein the mask 71 is mounted on the mask stage 81 or stored in the container stocker 238 or 239), power from the external device can be supplied to the electrode 111 through the power supply control circuit 112a. The mask stage 81 and container stockers 238 and 239 preferably have power supply portions, which supply power to the chuck 310.

The support base 82 of the chuck 310 and the mask 71, respectively, have marks (not shown) indicating position references. When the mask 71 is to be fixed to the support base 82, position adjustment is performed such that the relative positional relationship between the two marks falls within a predetermined deviation range. After the fixing, the positional shift amounts of the respective marks are measured. Whether or not the positional shift amounts of the marks fall within an allowable range is checked. Desirably, the positional shift amounts are stored as data. The data can be used as position correction data after the mask 71 is sent to the reticle stage 81 afterward.

The cover 20 serves as a dustproof cover, which prevents particles from becoming attached to the mask 71. The cover 320 is configured to include a cover member 101. The chuck 310 and cover 320 form the mask storage space 108, which store the mask 71. When a seal member 105, such as an O-ring, is arranged between the chuck 310 and cover 320, the mask storage space 108 is shielded from the external space. The seal member 105 can be provided to, e.g., the cover member 101.

The cover 320 can include a joint 104 (port) to vacuum-evacuate the mask storage space 108. When the joint 104 is connected to a vacuum evacuation line (e.g., the vacuum evacuation line 233a), the mask storage space 108 can be vacuum-evacuated. During the vacuum evacuation, the pressure difference between the inside and outside of the mask storage space 108 generates an urging force for the cover 320 with respect to the chuck 310 to hold the cover 320. The joint 104 can be provided to the chuck 310. The cover 320 can be fixed to the chuck 310 by another lock mechanism. A check valve, which allows gas to shift only from the mask storage space 108 toward the external space, can be arranged between the joint 104 and the mask storage space 108. Alternatively, a valve that can externally control opening/closing of the mask storage space 108 may be arranged between the joint 104 and the mask storage space 108.

The cover member 101 may be partly or entirely formed of a transparent member (a member which transmits ultraviolet rays or soft X-rays) so that electrification caused by fluid friction during vacuum evacuation is canceled by an irradiation ionizer.

The chuck 310 or cover 320 has a valve 113 to cancel the pressure difference between the inside and outside of the mask storage space 108, so that after the mask 71 is transported to the mask stage 81 in the vacuum chamber 203, the cover 320 can be separated from the chuck 310.

The cover 320 preferably has a mask drop preventive member 103 serving as a safety measure, so the mask 71 will not drop when the power supply capability from the battery 112 to the electrode 111 decreases (for example, when the output voltage falls below a regulated value). The cover 320 also preferably has kinematic couplings 102 to align the container 300 with the hand of a transport robot, when the container 300, which houses the mask, is to be transported by the transport robot. While the container 300 is configured as a container to transport a mask substrate, it can be configured as a container to transport a wafer substrate.

Figure 7:
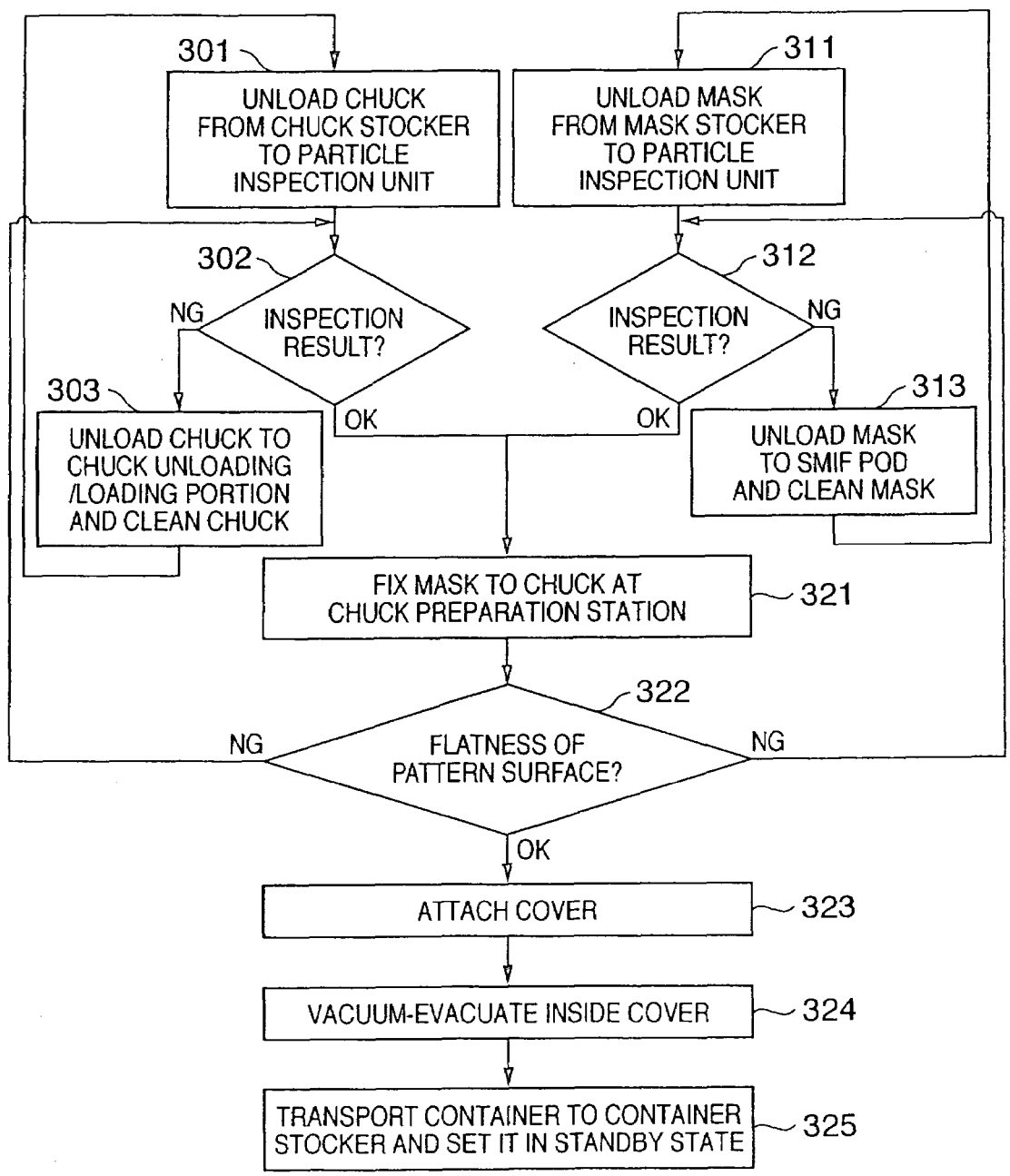
FIG. 7 is a flowchart showing a mask manipulation procedure (preparation procedure)

FIG. 7 is a flowchart showing a manipulation procedure (preparation procedure) for the mask 71. First, in step 301, the chuck 310 is transported from the chuck stocker 216 to the chuck particle inspection unit 242. In step 302, particle inspection of that surface (the support surface of the support base 82) of the chuck 310, which is to come into contact with the mask 71, is performed. If the result of the particle inspection is no good (NG), in step 303, the chuck 310 is unloaded outside of the apparatus via the unloading/loading portion 231, and cleaned. If the result of the particle inspection is acceptable (OK), the chuck 310 is transported to the mask preparation station 233. Typically, along with the above steps, in step 311, the mask 71 is transported from the reticle stocker 235 to the mask particle inspection unit 242. In step 312, particle inspection of the two surfaces (i.e., the exposure pattern surface and the contact surface with the chuck 310) of the mask 71, is performed. If the result of the particle inspection is NG, in step 313, the mask 71 is unloaded outside of the apparatus by using the SMIF pod 236, and cleaned. If the result of the particle inspection is OK, the mask 71 is transported to the mask preparation station 233.

After it is confirmed that no particle attaches to the chuck 310 or mask 71, in step 321, the mask 71 is fixed to the chuck 310. During the fixing, position adjustment is performed such that the relative positional relationship between the marks formed on the chuck 310 and mask 71 falls within a predetermined deviation range.

In step 322, the flatness of the pattern surface of the mask 71 or the distortion of the pattern drawn on the mask 71 is measured to check whether or not any particle is sandwiched between the chuck 312 and mask 71. When the measurement value might have an error due to the pattern, a plurality of flatness measurement regions may be formed in the pattern region or on the scribe line, and particle measurement may be performed in the measurement regions. Alternatively, an arbitrary mark may be formed in the pattern, and the presence/absence of the particle may be checked from the distortion of the mark. If the inspection result is NG, the chuck 312 and mask 71 are returned to steps 302 and 312, and particle inspection is performed again.

If the inspection result is OK, in step 323, the cover 320 is extracted from the cover stocker 240 and mounted on the chuck 310. In step 324, the vacuum evacuation line 233a is connected to the joint 104, and the mask storage space 108 is vacuum-evacuated. In this case, the pressure difference between the inside and outside of the mask storage space 108 urges the cover 320 and chuck 310 against each other, to fix the cover 320 to the chuck 310. This forms the container 300, which accommodates the mask 71. The pressure in the mask storage space 108 is preferably set to be lower than that in the vacuum chamber 203, so that when the container 300 is loaded in the vacuum chamber 203, the chuck 310 and cover 320 will not separate from each other.

In step 325, the container 300, which accommodates the mask 71, is transported to the container stocker 239 in the transport system chamber 228, or to the container stocker 238 in the vacuum chamber 203 through the load-lock chamber 214. The container 300 is then put in the container stocker 239 or 238 and set in a storage standby state.

The use procedure for the mask 71 will be described with reference to FIG. 8 and FIGS. 11A to 11C.

Figure 11C:
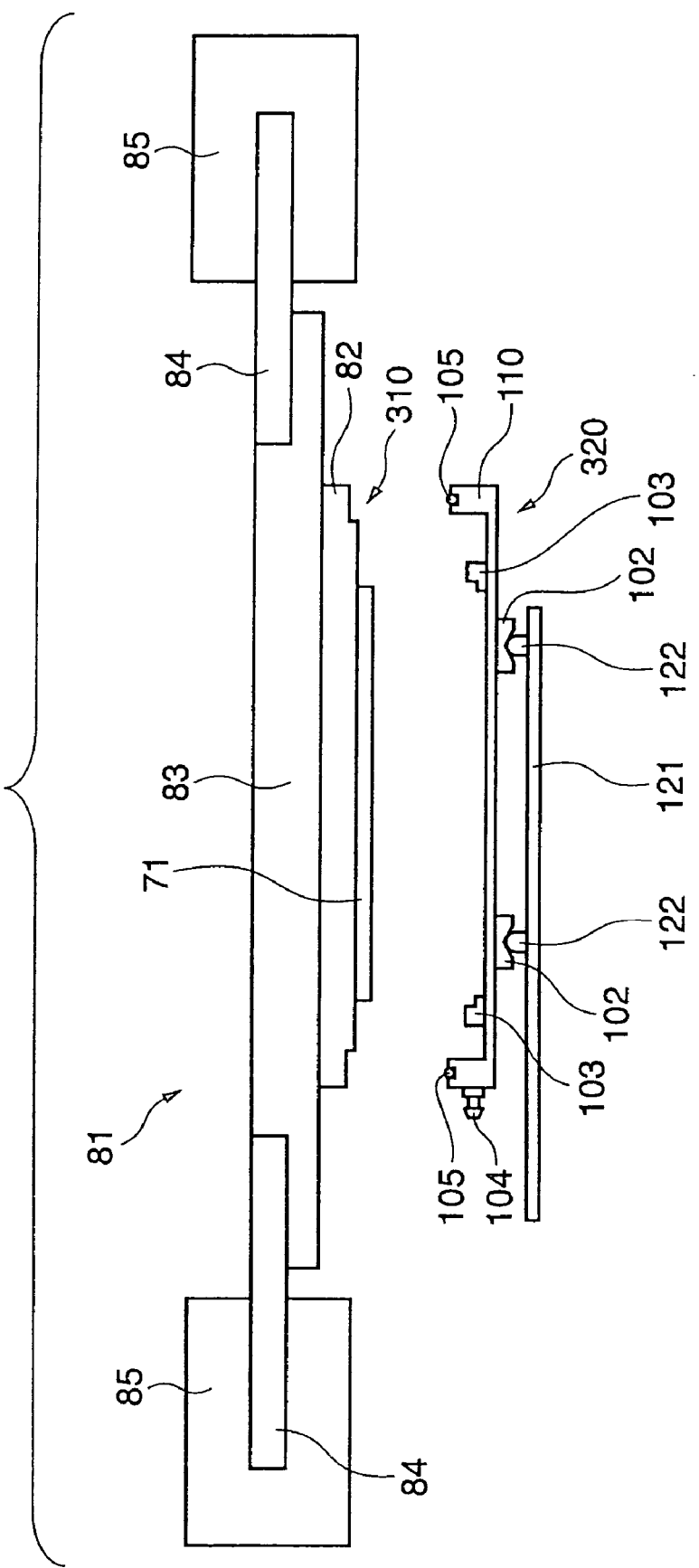
FIG. 11C is a view showing a mask use procedure (feed procedure)

As exemplified in FIGS. 11A to 11C, the reticle stage 81 has a top plate 83, linear motor movable elements 84 fixed to the top plate 83, linear motor stators 85 supported by the mask stage support 207 (FIG. 9), and aligning pins (engaging portions) 86 formed on the top plate 83.

The container 300, in which the mask 71 is held in the mask storage space 108 by the chuck 310, has aligning holes (engaging portions) 82a in the support base 82. When the aligning pins 86 are fitted in the aligning holes 82a, the container 300 (chuck 310) is aligned on the top plate 83 of the mask stage 81. The container 300 is manipulated by a transport hand 121 attached to the arm of the transport robot 211 (FIGS. 9 and 10). Kinematic coupling pins 122 are formed on the transport hand 121 and engage with the kinematic couplings 102 provided to the lower surface of a cover member 110 of the cover 320 so as to align the container 300 (accordingly, the chuck 310 and the mask 71 held by it) with the transport hand 121.

FIG. 11A shows a state wherein the container 300 is transported to below the reticle stage 81 by the transport robot 211. FIG. 11B shows a state wherein the transport hand 121 of the transport robot 211 moves upward to align and to fix the support base 82 of the chuck 310 on the top plate 83. In this state, the power supply terminal of the chuck 310 is connected to that of the top plate 83, and power is supplied from the top plate 83 to the clamp electrode 111 through the power supply control circuit 112a of the chuck 310.

Then, the valve 113 is opened to cancel the pressure difference between the inside and the outside of the mask storage space 108, and the cover 320 is removed from the chuck 310. FIG. 11C shows a state wherein the cover 320 is removed from the chuck 310. When removing the cover 320 from the chuck 310, the cover 320 may be adhered to the chuck 310 by the seal member 105, such as an O-ring. Therefore, preferably, a clamp mechanism, which clamps the cover 320, is provided on the transport hand 121, or the kinematic coupling pins 122 are replaced by collet kinematic clamps, which use vacuum chucking.

Figure 8:
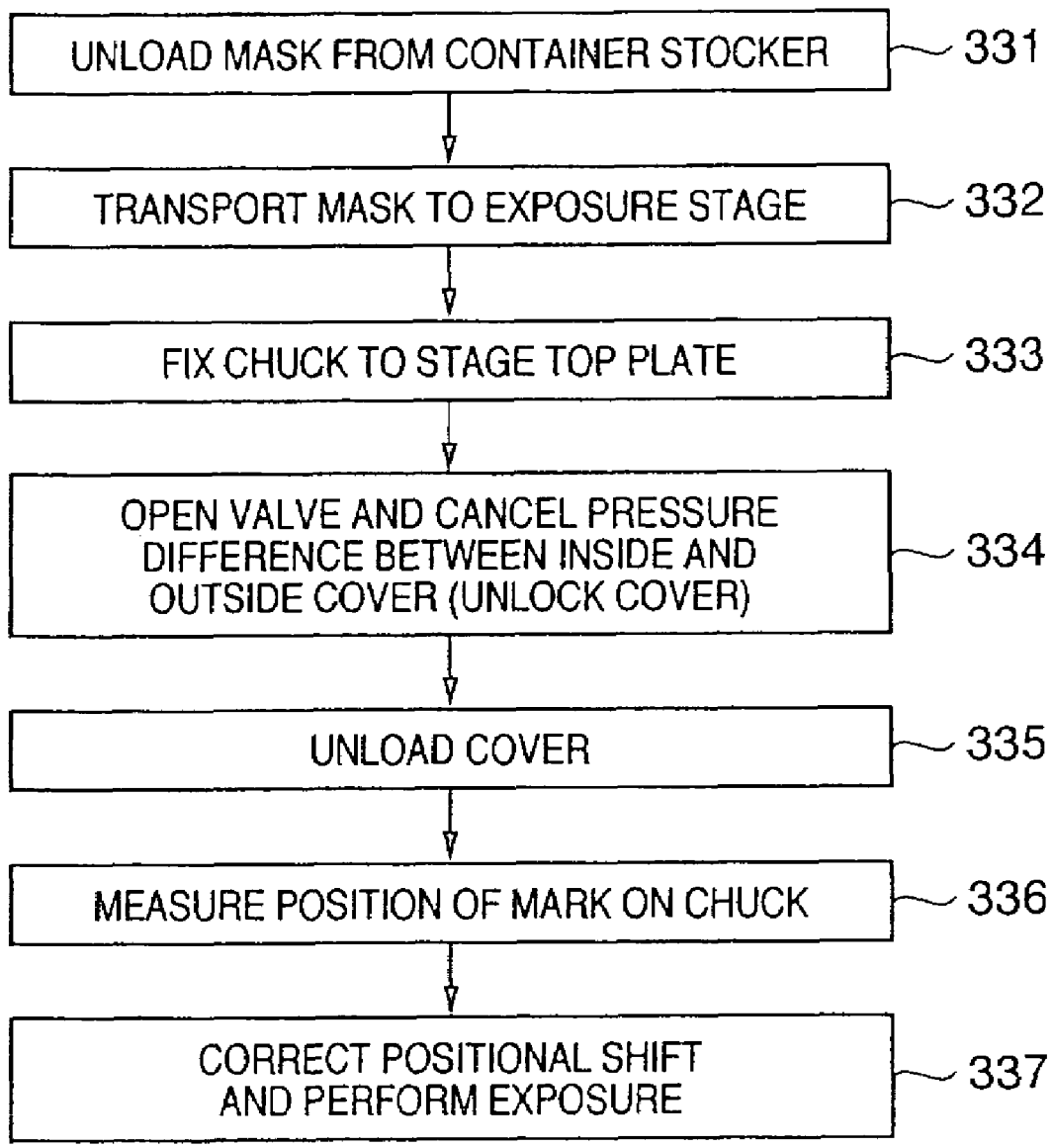
FIG. 8 is a flowchart showing a mask use procedure (feed procedure)

A description will be made with reference to FIG. 8. First, in step 33, the mask 71, which is stored with its cleanliness being guaranteed in advance, is extracted from the chuck stocker 239 or 238 as it is accommodated in the container 300. When the container 300 is to be extracted from the container stocker 239, it is guided into the vacuum chamber 203 through the load-lock chamber 214.

In step 332, the mask 71, accommodated in the container 300, is transported to the exposure stage. In step 333, the chuck 310, which forms part of the container 300, is fixed to the top plate 83. In this case, even if a particle is sandwiched between the chuck 310 and top plate 83, it will not largely influence the flatness of the pattern surface or the distortion of the pattern of the mask 71, because the chuck 310 is sufficiently rigid.

In step 334, the valve 113 is opened and the cover 320 is removed from the chuck 310. In step 335, the cover 320 is unloaded. In step 336, the positional shift amount between the reference mark on the chuck 310 and the reference mark on the wafer stage 209 is measured. In step 337, exposure is performed using both the value measured in step 336 and the positional shift amount of the reference mark between the chuck and mask, which is measured in step 321, as data for position correction of the mask and wafer.

Although the description is made on the assumption that the transport robot 211 is of the single hand type, to perform mask exchange on the reticle stage efficiently, it is preferable to employ a double hand type transport robot.

In this manner, when the surface accuracy of the exposure pattern surface is guaranteed in the previous step, and the mask 71 is transported with the cover attached until immediately before exposure, highly reliable particle management can be performed.

The mask preparation described in FIG. 7 need not always be performed in the exposure apparatus. A mask stocker in the factory may be provided with a similar mask preparation facility. The mask may be fixed to the chuck, and a cover may be attached to the chuck. Then, the mask may be supplied to the exposure apparatus.

An application to the vacuum exposure apparatus has been described as one embodiment of the present invention. When the present invention is to be applied to fluorine ($F_2$) excimer laser exposure, the mask storage space 108 may be purged with an inert gas. In this case, the inert gas fills the mask storage space 108 through the joint 104.

Second Embodiment

Figure 6:
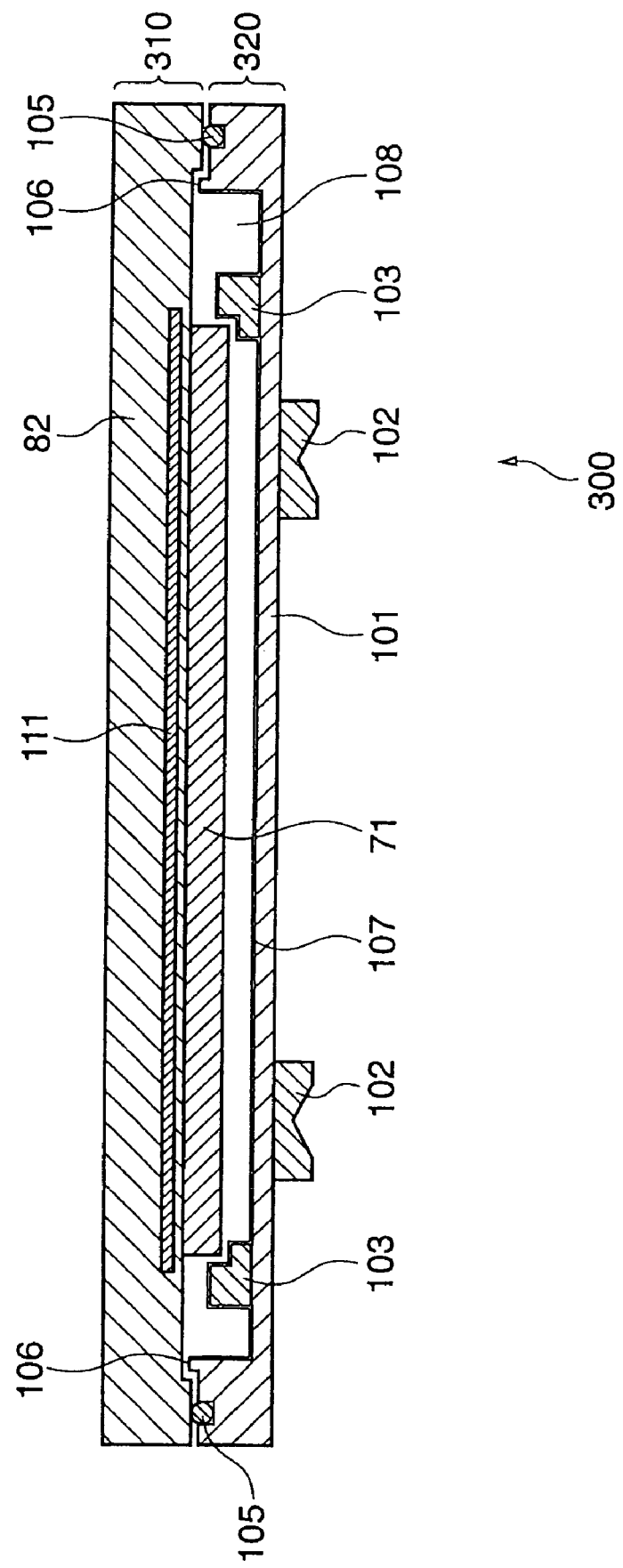
FIG. 6 is a sectional view showing the schematic structure of a mask container according to the second embodiment of the present invention.

FIG. 6 is a sectional view showing the schematic structure of a mask container according to the second embodiment of the present invention. Portions that are common to the first embodiment are denoted by the same reference numerals. A mask container 300 according to the second embodiment is provided with a dustproof wall 106. This prevents a particle produced by an O-ring 105 from dropping inside a cover 320 when the cover 320 is to be removed after the mask container 300 is supplied to a reticle stage. If a plurality of dustproof walls 106 are provided to both the cover 320 and a chuck 310 to form a labyrinth, the dustproof performance may be improved.

In case a particle should attach to the inside of a cover member 101, when a mask storage space 108 is vacuum-evacuated, the particle may float in the mask storage space 108 and attach to the mask. In order to prevent this, an adhesive 107 may be applied to the inner surface of the cover member 101 of the chuck 310 to trap the particle. As the adhesive 107, a fluorine-based adhesive, which produces a small amount of gas, is suitable.

Third Embodiment

Figure 12:
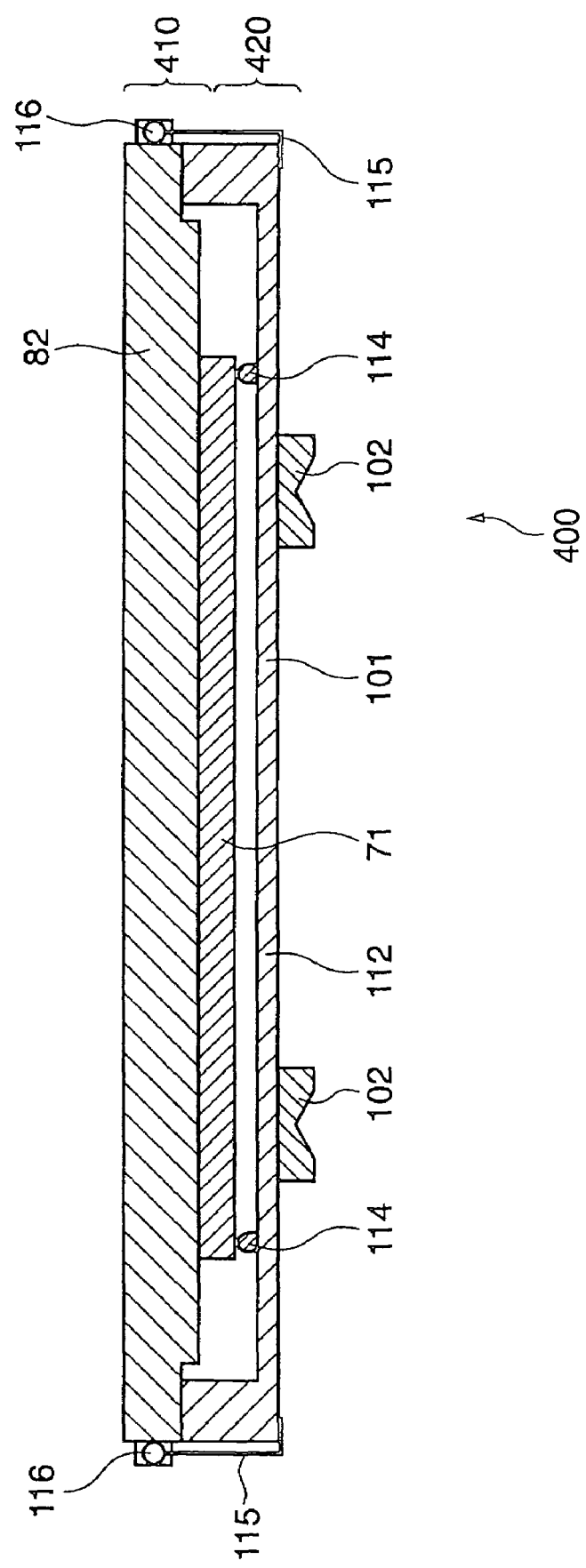
FIG. 12 is a sectional view showing the schematic structure of a mask container according to the third embodiment of the present invention.

The present invention has a dustproof effect, not only for transportation in a vacuum or inert purge atmosphere, but also for transportation in the ordinary atmosphere. FIG. 12 is a sectional view showing the schematic structure of a mask container according to the third embodiment of the present invention. The mask container of the third embodiment is an application to transportation in the atmosphere.

A mask container 400 according to the third embodiment is a container which accommodates a mask 71, and is formed of a chuck 410 and cover 420. The cover 420 has mask retainers 114, which hold the mask 7y1 by urging it against a support base 82 of the chuck 410. For example, the mask retainers 114 can be made of an elastic body, such as rubber. The cover 420 is fixed to the chuck 410 by lock levers (lock mechanisms) 115. For example, the lock levers 115 are configured to respectively pivot about rotating shafts 116 provided as fulcrums to the chuck 410. When transporting the mask 71 by holding it by the mask retainers 114, and fixing the chuck to a stage 1, the mask 71 is fixed to the chuck by vacuum chucking. In this case, a position reference mark on the mask may be measured and used as correction data of the stage drive target position. Alternatively, before fixing the mask to the chuck by vacuum chucking, position adjustment may be performed, such that the reference mark on the mask falls within a predetermined deviation range with respect to the position reference of the chuck, and, after that, the mask may be fixed to the chuck. A reticle stage for exposure with ultraviolet rays, such as i-line or a KrF, an ArF, or a fluorine ($F_2$) excimer laser is usually formed, such that a chuck and EUV stage are inverted upside down. Thus, for transportation as well, the mask container 400 may be transported, such that it is inverted upside down from the state shown in FIG. 12.

[Application]

Figure 13:
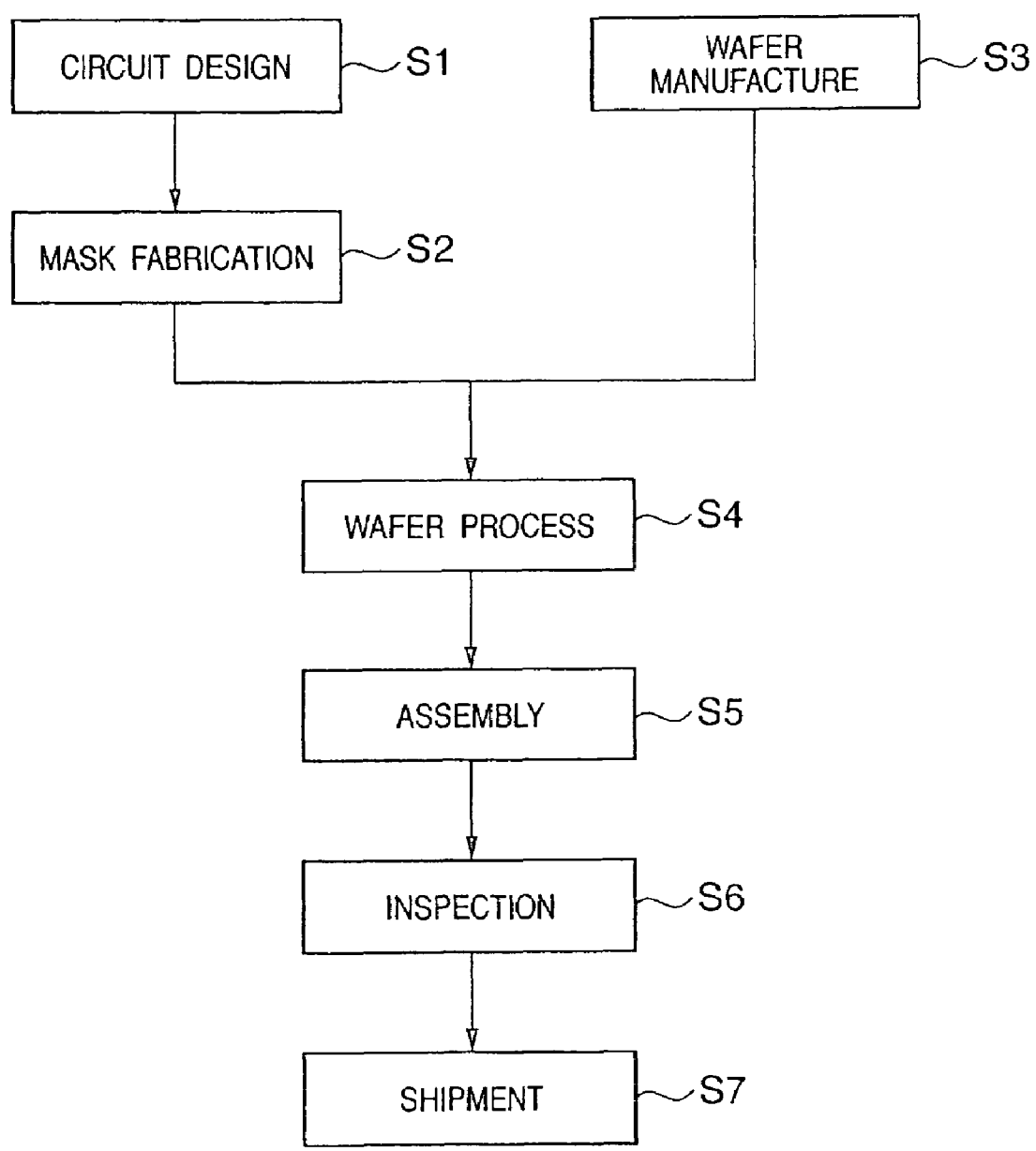
FIG. 13 is a flowchart showing an entire semiconductor device manufacturing process.

A semiconductor device manufacturing process using the exposure apparatus described above will be described. FIG. 13 is a flowchart showing the flow of an entire semiconductor device manufacturing process. In step S1 (circuit design), the circuit of a semiconductor device is designed. In step S2 (mask fabrication), a mask is fabricated on the basis of the designed circuit pattern. In step S3 (wafer manufacture), a wafer is manufactured using a material such as silicon. In step S4 (wafer process), called a preprocess, an actual circuit is formed on the wafer in accordance with lithography using the mask and wafer described above. In the next step, step S5 (assembly), called a post-process, a semiconductor chip is formed from the wafer fabricated in step S4. This step includes processes such as assembly (dicing and bonding) and packing (chip encapsulation). In step S6 (inspection), inspections, such as an operation check test and a durability test, of the semiconductor device fabricated in step S5, are performed. A semiconductor device is finished with these steps and shipped (step S7).

FIG. 14 is a flowchart showing the flow of the above wafer process in detail. In step S11 (oxidation), the surface of the wafer is oxidized. In step S12 (CVD), an insulating film is formed on the wafer surface. In step S13 (electrode formation), an electrode is formed on the wafer by deposition. In step S14 (ion implantation), ions are implanted in the wafer. In step S15 (resist process), a photosensitive agent is applied to the wafer. In step S16 (exposure), the circuit pattern is transferred to the wafer applied with the photosensitive agent by the exposure apparatus described above to form a latent image pattern. A substrate as a mask or a substrate as a wafer is transported in accordance with the method described above. In step S17 (development), the latent image pattern transferred to the wafer is developed to form a resist pattern. In step S18 (etching), portions other than the developed resist image are removed. In step S19 (resist removal), any unnecessary resist after etching is removed. These steps are repeated to form multiple circuit patterns on the wafer.

[Utility]

As has been described above, according to the respective embodiments, a substrate, such as a mask or wafer, can be transported, while protecting it from a particle, and use of the substrate after transportation can be facilitated.

More specifically, the substrate is transported as it is held in a storage space, formed of a chuck and cover, by the chuck. Thus, the substrate can be protected from the particle during transportation. After the transportation, the cover is removed from the chuck. Thus, the substrate held by the chuck can be used immediately.

While the substrate is fixed to the chuck, it is checked that the surface accuracy of the substrate falls within an allowable range. The cover is fixed to the chuck to form a container, which is to accommodate the substrate. The substrate is transported as it is accommodated in the container. After that, the cover is separated from the chuck, and the substrate held by the chuck is used or processed. Thus, the substrate can be used or processed within a short period of time while preventing any particle from attaching to the substrate. For example, assume that this container is to be applied for transportation of a mask. In this case, a mask may be prepared, such that its surface accuracy and particle attaching are guaranteed to fall within allowable ranges. When necessary, the mask can be accommodated in the container and provided to a mask stage quickly.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for performing exposure of a substrate to light via a reticle, the apparatus comprising:
    a first stage configured to hold a chuck, the chuck having a support base with an electrode, the chuck being configured to form a container, for the reticle, together with a cover, the container being configured to electrostatically chuck the reticle on the support base by the electrode;
    a transporter configured to transport the container in which the reticle is contained, and to load the chuck, which chucks the reticle, on the first stage without the cover; and
    a second stage configured to hold the other of the substrate, wherein the apparatus is configured to obtain a first positional shift amount between the chuck and the reticle chucked on the chuck before the transportation by the transporter, to measure a second positional shift amount between a reference mark on the chuck held by the first stage and a reference mark on the second stage, and to correct positions of the first and second stages based on the first and second positional shift amounts, to perform the exposure.

2. An apparatus according to claim 1, wherein the apparatus is configured to perform one of evacuating the container and filling the container with an inert gas via a port included in the container.

3. An apparatus according to claim 1, wherein the apparatus is configured to supply power to the chuck.

4. An apparatus according to claim 1, wherein the transporter includes a kinematic coupling mechanism to be coupled to the container.

5. An apparatus according to claim 1, wherein the apparatus is configured to align the chuck with the first stage.

6. A method of manufacturing a device, the method comprising steps of:

exposing a substrate to light using an exposure apparatus defined in claim 1;

developing the exposed substrate; and processing the developed substrate to manufacture the device.

* * * * *